United States Patent
Hedberg et al.

(10) Patent No.: US 7,321,239 B2
(45) Date of Patent: Jan. 22, 2008

(54) DIFFERENTIAL LINE RECEIVER

(75) Inventors: Mats Olof Joakim Hedberg, Haninge (SE); Tord Haulin, Uppsala (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 654 days.

(21) Appl. No.: 10/482,811

(22) PCT Filed: Jun. 28, 2002

(86) PCT No.: PCT/EP02/07186

§ 371 (c)(1),
(2), (4) Date: Jun. 22, 2004

(87) PCT Pub. No.: WO03/005587

PCT Pub. Date: Jan. 16, 2003

(65) Prior Publication Data

US 2004/0247036 A1  Dec. 9, 2004

(30) Foreign Application Priority Data

Jul. 5, 2001 (EP) .................................. 01115699

(51) Int. Cl.
*H03K 19/20* (2006.01)
*H03K 19/094* (2006.01)

(52) U.S. Cl. ........................................ 326/82; 326/115

(58) Field of Classification Search ................ 326/115, 326/112, 121, 82, 83, 86, 26, 27

See application file for complete search history.

(56) References Cited

U.S. PATENT DOCUMENTS 4,714,895 A    12/1987  Nicollini et al.

(Continued)

FOREIGN PATENT DOCUMENTS

DE    42 18 533 C2    12/1992

(Continued)

OTHER PUBLICATIONS

International Preliminary Examination Report mailed Jun. 11, 2004 in corresponding PCT Application No. PCT/EP02/07186.

(Continued)

*Primary Examiner*—Rexford Barnie
*Assistant Examiner*—Thienvu Tran
(74) *Attorney, Agent, or Firm*—Nixon & Vanderhye, P.C.

(57) ABSTRACT

In a differential line receiver circuit having differential amplifier circuit where output rise and fall times are influenced by the ability of internal current sources to charge parasitic capacitances, a feedback circuit is provided to tune those current sources so as to deliver equal rise and fall time on both outputs. According to one embodiment a detector signal is derived from timing errors resulting from such rise and fall time discrepancies by means of a nested CMOS inverter arrangement coupled to an integrating element, and then used to control one or both of said current sources. It is further disclosed how deviations in the center voltage of the internal power supplies caused by the current source tuning can be allowed for by pre-processing of the signal at the input of the differential line receiver circuit by means of a differential signal transfer circuit which is able to impose a common mode signal on the input signal so as to match the center voltage of the differential amplifiers internal power supply.

13 Claims, 6 Drawing Sheets

U.S. PATENT DOCUMENTS 5,304,856 A 4/1994 Rainal
6,236,242 B1 * 5/2001 Hedberg .................. 327/65

FOREIGN PATENT DOCUMENTS

| DE | 38 71 614 T2 | 1/1993 |
| DE | 42 23 845 A1 | 1/1993 |
| DE | 41 33 243 A1 | 4/1993 |
| DE | 38 89 085 T2 | 7/1994 |
| DE | 44 21 072 C2 | 12/1995 |
| EP | 0 297 715 A2 | 1/1989 |
| EP | 0 690 564 A1 | 1/1996 |
| EP | 0 840 442 A1 | 5/1998 |

OTHER PUBLICATIONS

International Search Report mailed Aug. 30, 2001 in corresponding EP application No. 01115699.9-2214.

* cited by examiner

BALANCED P AND N CHANNEL

LOWER CURRENT FROM P CURRENT SOURCE, RESULTING IN SLOWER FALL TIME

LOWER CURRENT FROM N CURRENT SOURCE, RESULTING IN SLOWER FALL TIME

DIFFERENTIAL LINE RECEIVER

This application is the US national phase of international application PCT/EP02/07186 filed 28 Jun. 2002, which designated the US. PCT/EP02/07186 claims these applications are incorporated herein by reference.

TECHNICAL FIELD OF THE INVENTION

Differential digital signals are used for carrying digital data coded as a difference voltage between a pair of conductors. This data format has the advantage of being more immune to noise and cross talk than are single ended signals. The noise immunity is based on impedance balance and common mode rejection. For properly designed conductor pairs, noise and cross talk impact the two branches of a differential pair in a similar fashion. Impact on the differential signal component is limited. This first order noise suppression can be maintained also when connecting transmitters and receivers to the differential line, given that their impedances are well balanced.

Differential amplifiers operated in loop configurations as limiting voltage comparators are an efficient means for receiving low amplitude digital signals. Internally on digital CMOS circuits the digital information is represented as VDD to VSS full swing signals. The level conversion is done in one or two high impedance stages operating with a pull-up pull-down impedance ratio. At least one and sometimes both of the pull-up and pull-down impedances depend on input signal amplitude with control exercised via one or more differential gain stages. With increasing data rates and decreasing supply voltages, a precise setting of the impedance ratio in the high impedance stage is becoming more critical. The impedance ratio is impacted by variations in manufacturing, supply voltage, temperature and input signal common mode level. State of the art differential voltage comparators and amplifiers use pull-up pull-down impedance ratios set by design. This is done as compromise fit across the range of operating conditions. A less than perfect pull-up to pull-down impedance ratio leads to offset and pulse width distortion. That happens because the differential voltage comparator or amplifier will not be at its equilibrium when the input differential signal is zero. Furthermore, the current available for charging and discharging parasitic capacitances in the high impedance stages will differ, leading to different internal signal rise and fall times. Altogether, this will reduce the useful data rate or frequency range as well as the sensitivity or amplitude range.

Variations in the relative rise and fall times of the two outputs of a line receiver impose a timing error on the output signal. These errors naturally reduce the circuit's usefulness, particularly in high-speed applications.

DESCRIPTION OF THE PRIOR ART

EP 0 690 564 describes a voltage controlled oscillator in which a differential clock signal is fed into a differential comparator. Any common mode error in the input signal will be apparent at the comparator's output as a discrepancy between the mark-space ratios of the signals on the two outputs. A nested inverter structure coupled to an integrating element is used to derive a common mode information signal from such mark-space ratio discrepancies, which is then used to correct common mode errors.

STATEMENT OF INVENTION

The purpose of this invention is to overcome these and other limitations. The present invention is defined in the independent claims. Advantageous embodiments are defined in the dependent claims.

A part of the solution to the matching limitations discussed above according to the present invention consists of creating an adaptive circuit adjusting the pull-up to pull-down ratio. Under normal operating conditions for a limiting amplifier, the high impedance stage signal levels for a 1- and a 0 symbol are defined by the input data, not by the pull up pull down ratio to be adjusted. Therefore, information on the pull up pull down ratio cannot be gathered when the line receiver amplifier has resolved the input signal into a steady state level. Since the pull up pull down ratio only affects transitions between the two states, this problem is resolved by considering the outputs between stable states, that is, in transition periods.

According to an embodiment of the invention, a differential line receiver circuit comprises a first current source and a second current source for generating respective source currents in accordance with respective current level control signals. A switching stage switches the currents generated by said first and second current sources into an output stage of the line receiver circuit. The output stage translates the currents into a differential binary output signal, e.g. a CMOS signal. Due to parasitic capacitances like the gate capacitance in every MOS FET, timing properties like rise time, fall time of the edges of the output signal will depend on the current levels received by the output stage from the switching stage. Switching takes place in accordance with the received differential input signal. A current source control circuit is provided for controlling at least one of the first and second current sources, i.e. the amount of current generated by the respective current source. Most advantageously, the first and second current sources are reciprocally controlled by said current source control circuit such that the current level of one of the current sources decreases while the current level of the other current source increases, this reciprocal control operation resembling to some extent the movement of a beam balance. However, controlling the current level of just one current source of the two would be sufficient in principle.

The current source control circuit in turn receives a detector signal indicating whether the differential binary output signals provided by the line receiver circuit are symmetrical or not. If the detector signal indicates a lack of symmetry, the current source control circuit adjusts the current level of at least one of the first and the second current source in a direction suitable for establishing symmetry in the differential output signal.

A lack of symmetry in the differential output signal can occur for example as a deviation between the rise time and the fall time of the output signals, and/or as a deviation in the timing of the rising and falling edges, e.g. phase deviations. Such lack of symmetry would result in a reduction of the opening of the eye diagram. The present invention contributes to keeping the eye diagram open.

DETAILED DESCRIPTION OF THE PREFERRED EMBODIMENTS

Figure 1:
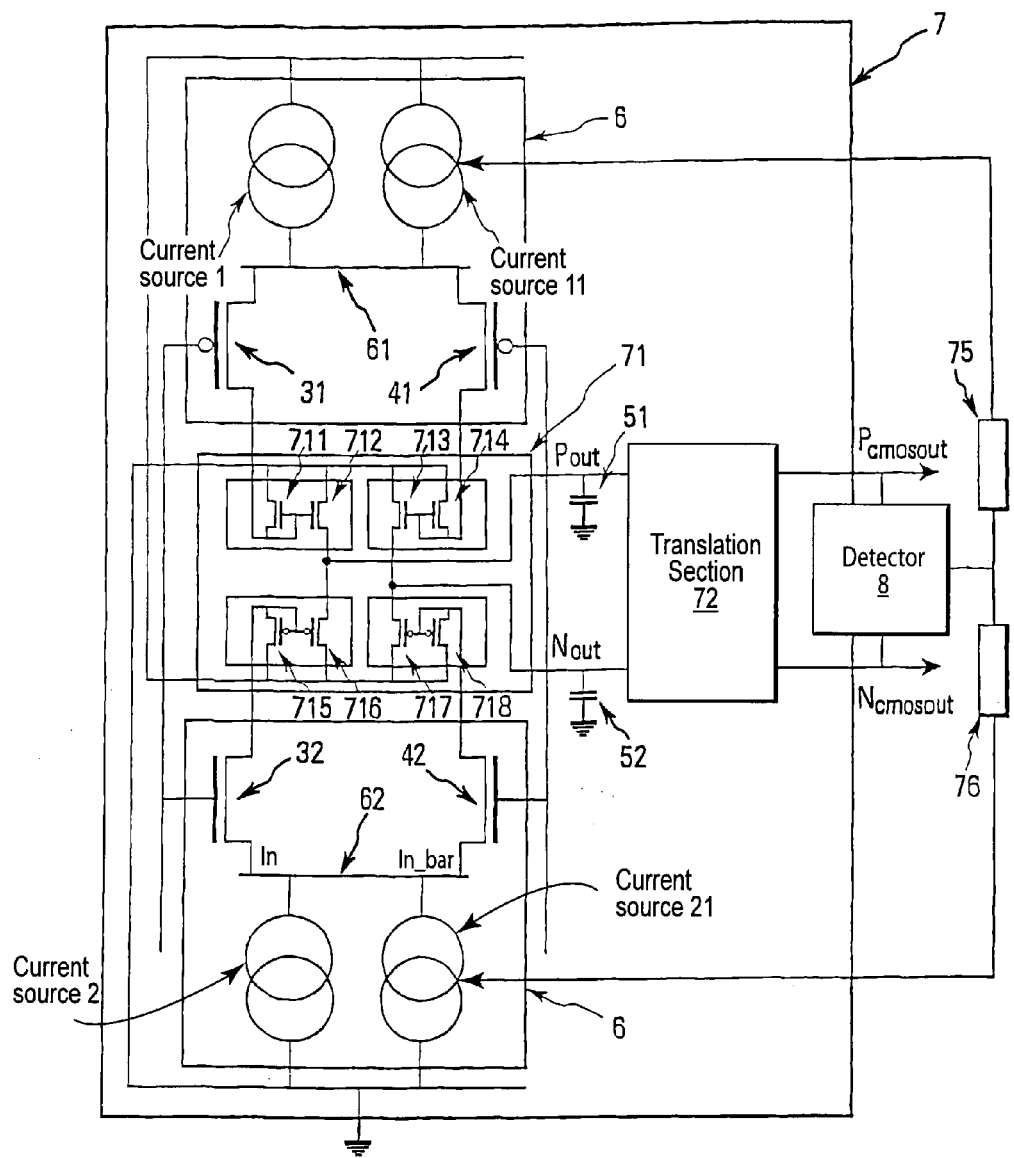
FIG. 1 shows a first embodiment of the present invention.

FIG. 1 shows a differential amplifier design of a kind which may be considered for use in the kind of application discussed above. Two current sources 1 and 2 are provided so as to supply two current supply nodes 61 and 62 with a source and sink current, respectively. An output stage having a circuit 71 and a subsequent section 72 is provided, and connected to said current supply node 61 and 62 by two P-type transistors 31 and 41, the source of each transistor being connected to the upper current supply node 61 and the drain being connected to the output stage, and two N-type transistors 32 and 42, the drain of each transistor being connected to the output stage 71, 72 and the source being connected to the lower current supply node 62. The gates of these four transistors are connected in complementary pairs 31 and 32 and 41 and 42, respectively, the gates of the first pair being coupled to one differential input of the differential amplifier, and the other pair being coupled to the other input of the differential amplifier.

Section 71 of the output stage comprises four P channel transistors 711, 712, 713, 714 and for N channel transistors 715, 716, 717, 718, arranged in four pairs 711 and 712, 713 and 714, 715 and 716, 717 and 718, where the gates of the transistors in each pair are connected.

The sources of the P type transistors are connected to the positive power supply rail, and in each pair of P type transistors the drain of one transistor 715, 718 is connected to it's own gate and to one of the N type switching transistors outside the output stage 32, 42, and the drain of the other 716, 717 is connected to one of the output nodes.

The sources of the N type transistors are connected to the negative power supply rail, and in each pair of N type transistors the drain of one transistor 711, 714 is connected to it's own gate and to one of the P type switching transistors outside the output stage 31, 41, and the drain of the other 712, 713 is connected to one of the output nodes.

Each output node is thus connected to the drain of one P channel transistor, and to the drain of one N type transistor.

Thus four current mirrors are formed supplying two nodes, which are connected to the outputs P out and N out respectively. Each current mirror is connected to one of the switching transistors 31, 41, 32 and 42 described above, such that when a current flows through a switching transistor, this current is mirrored at the output node.

Considering the operation of the switching transistors 31, 41, 32 and 42 and the output stage 71, 72 together, if a differential signal is present at the input of the device such that a logical high is present at the gates of transistors 31 and 32, and correspondingly a logical low is present at the gates of transistors 41 and 42, the P type transistor 41 enters a conducting state such that a current flows from the upper current supply node, through the transistor 714 ad down to the negative power supply rail. Since transistors 713 and 714 are arranged in a current mirror configuration, transistor 713 attempts to draw a current matching the current flowing through transistor 714 from the output node, thus realising a logical low at the output.

In a similar manner, the N type transistor 32 enters a conducting state such that a current flows from the positive power supply rail, through the transistor 715 and down to the negative power supply rail. Since Transistors 715 and 716 are arranged in a current mirror configuration, transistor 716 attempts to push a current matching the current flowing through transistor 715 through the output node, thus realising a logical high at the output.

In this manner the logical value at the input is mirrored at the output, but with a potential rail-to-rail voltage swing.

The output of section 71 is, as discussed above, a current representative of the logical value at the input. In order to convert this current into a digital signal having logical values equal to the positive and negative power supply rail voltages there is provided a CMOS translation circuit 72.

Figure 3A:
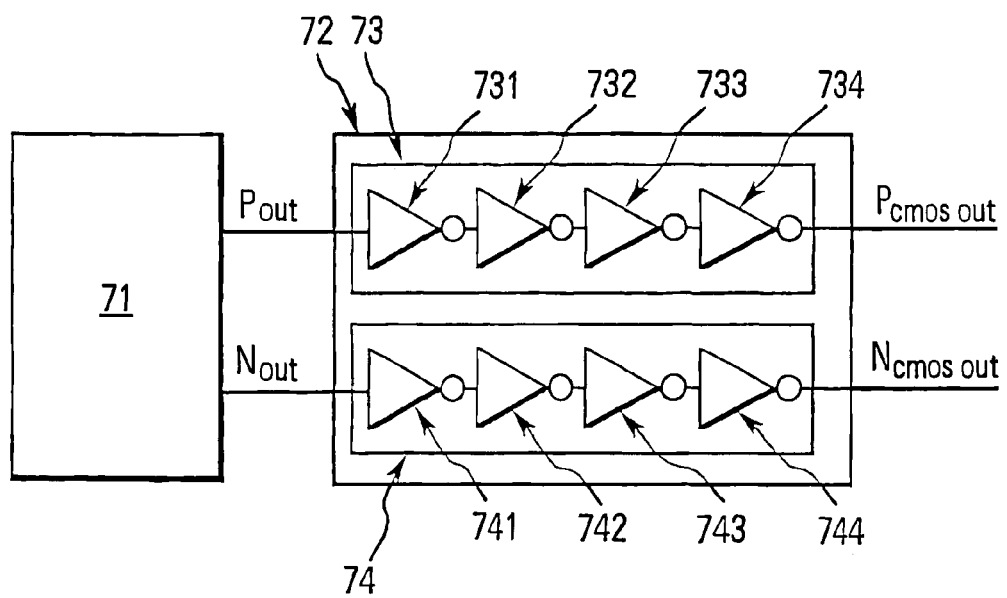
FIG. 3a shows in more detail a possible embodiment of the CMOS translation section 72 at the output of the amplifying circuit 71

FIG. 3a shows in more detail a possible embodiment of the CMOS translation section 72 at the output of the amplifying circuit 71. The CMOS translation section comprises two CMOS translation circuits 73 and 74, each comprising four CMOS inverters 731, 732, 733, 734, and 741, 742, 743, 744 respectively. Each output node of section 71 is connected to the input of one of these translation circuits 73 or 74.

Figure 3B:
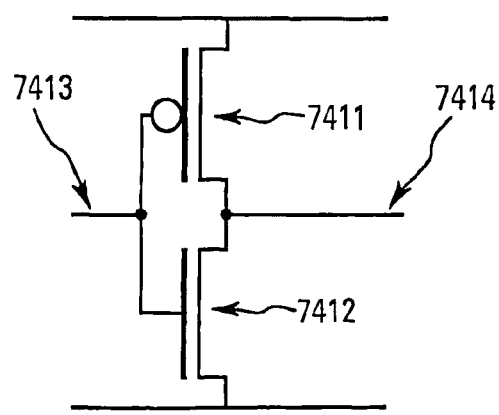
FIG. 3b shows the structure of a conventional CMOS inverter.

A conventional CMOS inverter as shown in FIG. 3b, comprises an input node 7413, an output node 7414, a P channel MOSFET transistor 7411 and an N channel MOSFET transistor 7412, where the gate of both the P channel and the N channel transistor is connected to the input node 7413, the source of the P channel transistor is connected to the positive power supply rail, the source of the N channel transistor 7412 is connected to the negative power supply rail and the drain of the N channel transistor and the drain of the P channel transistor are connected together and to the output node 7414.

In operation the inverters forming each CMOS translation circuit will swing between their positive and negative power supply values in phase with the voltage changes at the output nodes of section 71, and substantially 180° out of phase with each other so that the differential output formed by the difference between signals at $P_{CMOS\ out}$ and $N_{CMOS\ out}$ will fall within well defined limits, which is of importance to the functioning of subsequent system portions (not shown) which process the signal received by the digital line receiver circuit from the transmission line. The timing error detection circuit monitors properties of this differential output as described below.

The circuitry of the amplifier 7 naturally has various associated parasitic capacitances 51, 52, so for a voltage to appear at a particular output node, a parasitic capacitance 51, 52 must be charged. The currents required to charge this capacitance 51, 52 are provided by the current sources 1 and 2, respectively, or they may be provided by mirror current sources corresponding to current sources 1 and 2. Thus, the level of current provided by the current sources affect the rate at which the capacitances can be charged 51, 52, and therefore the rise and fall time of the circuit output.

When one of the current sources provides a higher current than the other, the result will be a difference between the fall time at the amplifier output, and the rise time. This may be interpreted as a timing error or a phase difference between the two signals by external components, or more generally as a closing of the eye diagram.

Figure 2A:
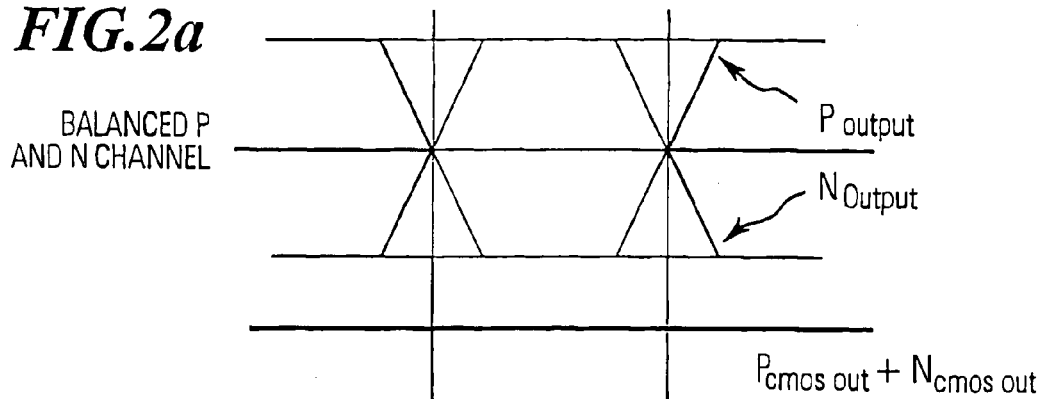
FIGS. 2a, 2b and 2c show a series of graphs representing timing errors resulting from differences in the current provided by the two current sources 1 and 2.
Figure 2B:
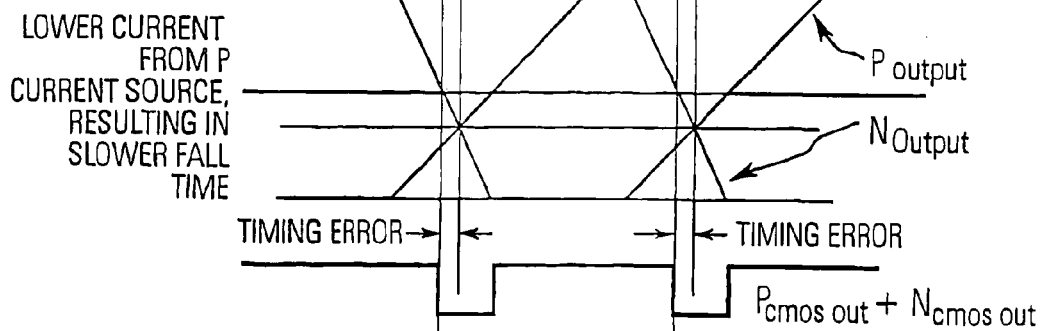
Figure 2C:
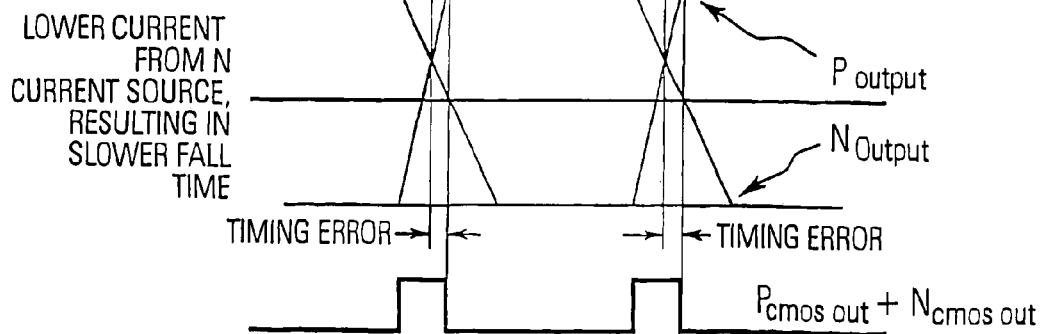

This effect is illustrated in FIGS. 2a, 2b and 2c, which show a series of graphs representing timing errors resulting from differences in the current provided by the two current sources 1 and 2. In FIG. 2a it is shown how when the currents available on the current supply nodes 61 and 62 are properly balanced such that the rise and fall times for the differential output of the amplifier are equal, the CMOS translation circuit at each output will be triggered simultaneously such that the two signals will show a symmetrical transition behaviour.

In FIG. 2b it is shown how when the N current source provide less current to the current supply node 62 than the P current source supplies to the current supply node 61, the rise time of the output will be slower than the fall time. The result of which is that the CMOS translator on one output (whichever is falling) will be triggered before the CMOS translator on the other output, so that the outputs of the two CMOS translators will momentarily both be low.

Similarly, in FIG. 2c it is shown how when the N current source provide more current to the current supply rail 62 than the P current source supplies to the upper current supply rail 61, the fall time of the output will be slower than the rise time. The result of which is that the CMOS translator on one output 73 or 74 (whichever is rising) will be triggered before the CMOS translator 73 or 74 on the other output, so that the outputs of the two CMOS translators 73 and 74 will momentarily both be high.

Turning back to FIG. 1, a circuit 8 is provided, which is able to detect timing errors in the output differential signal, and to produce a control signal representative thereof. This control signal is used to control two further current sources 11 and 21, which are able to supplement selectively the current available on these current supply rails 61 and 62, so as to cancel out any disparity in the current provided by the current sources 1 and 2, and therefore provide a balanced source of current for each of the circuits through the amplifying circuitry 71, thus eliminating a source of timing error.

Figure 4:
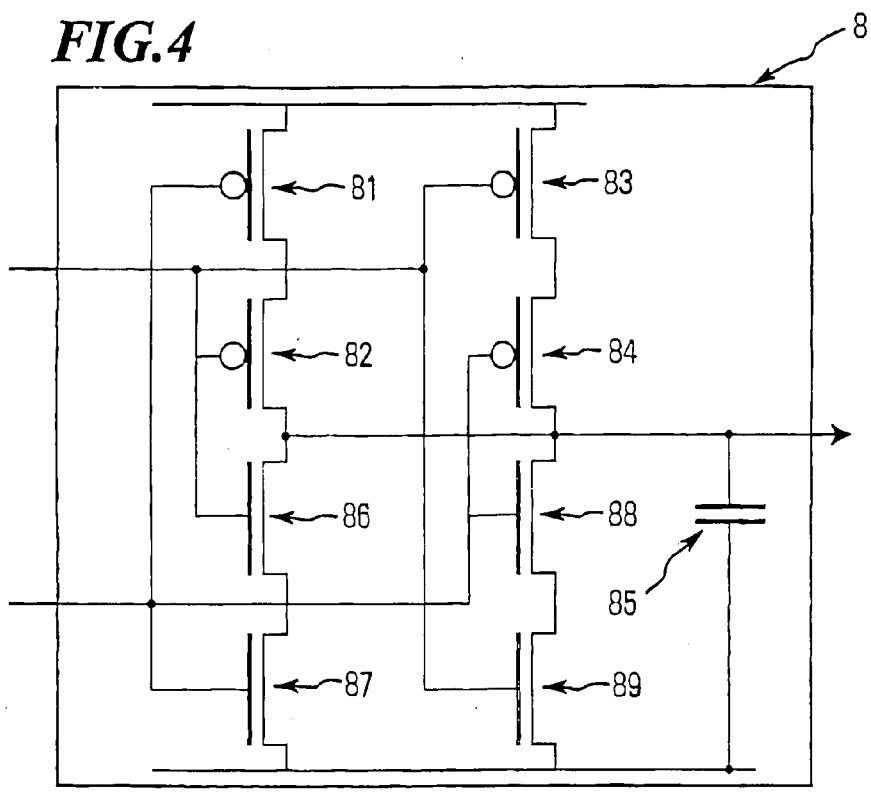
FIG. 4 shows details of the timing error detection circuit 8 of the embodiment of the present invention of FIG. 1.

FIG. 4 shows one possible arrangement for the circuitry of the timing deviation detector unit 8. According to the circuitry shown in FIG. 4, there are provided four P-transistors 81, 82, 83, and 84, and four N-transistors 86, 87, 88, and 89. The sources of transistors 81 and 83 are connected to the positive power supply rail and the sources of transistors 87 and 89 are connected to the ground rail. The drain of transistor 81 is connected to the source of transistor 82, the drain of transistor 83 is connected to the source of transistor 84, the drain of transistor 82 is connected to the drain of transistor 86, the drain of transistor 84 is connected to the drain of transistor 88, the source of transistor 86 is connected to the drain of transistor 87, and the source of transistor 88 is connected to the drain of transistor 89. The gates of transistor 81, 87, 84, and 88 are connected to the output of the amplifying circuit 7, and the gates of transistors 83, 82, 86, and 89 are connected to the N-output of the amplifying circuit 7. The drains of transistors 82 and 84 and the drains of transistors 86 and 88 are connected to an integrating element 85 (a capacitor) and the output of the timing error detection unit. The transistors 81, 82, 86, 87 form a first branch while transistors 83, 84, 88, 89 form a second branch. Each branch in this embodiment consists of two nested CMOS inverters. The inner CMOS inverter of the first branch is constituted by transistors 82, 86, while the outer CMOS inverter of this branch is constituted by transistors 81, 87. Similarly, the transistors 84, 88 constitute the inner CMOS inverter of the second branch, while the transistors 83, 89 constitute the outer CMOS inverter of this branch. This structure is symmetrical which is advantageous for low detection errors at high data rates.

Figure 5A:
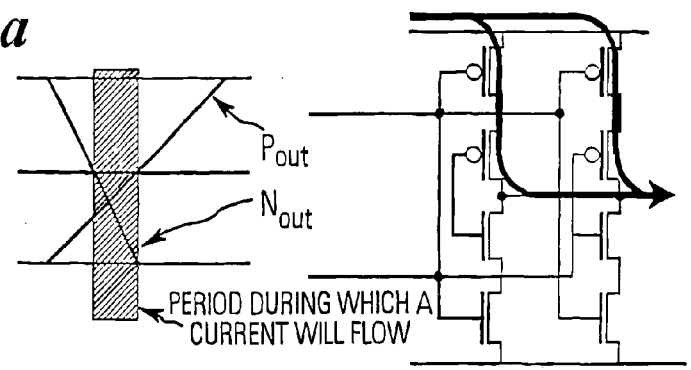
FIGS. 5a and 5b are explanatory diagrams relating to the functioning of the circuit of FIG. 4.
Figure 5B:
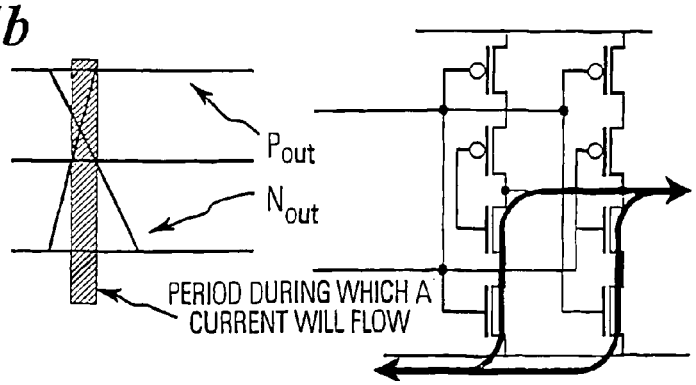

FIGS. 5a and 5b are explanatory diagrams relating to the functioning of the timing deviation detector circuit of FIG. 5, with the help of which the functioning of this circuit will now be explained.

Figure 6:
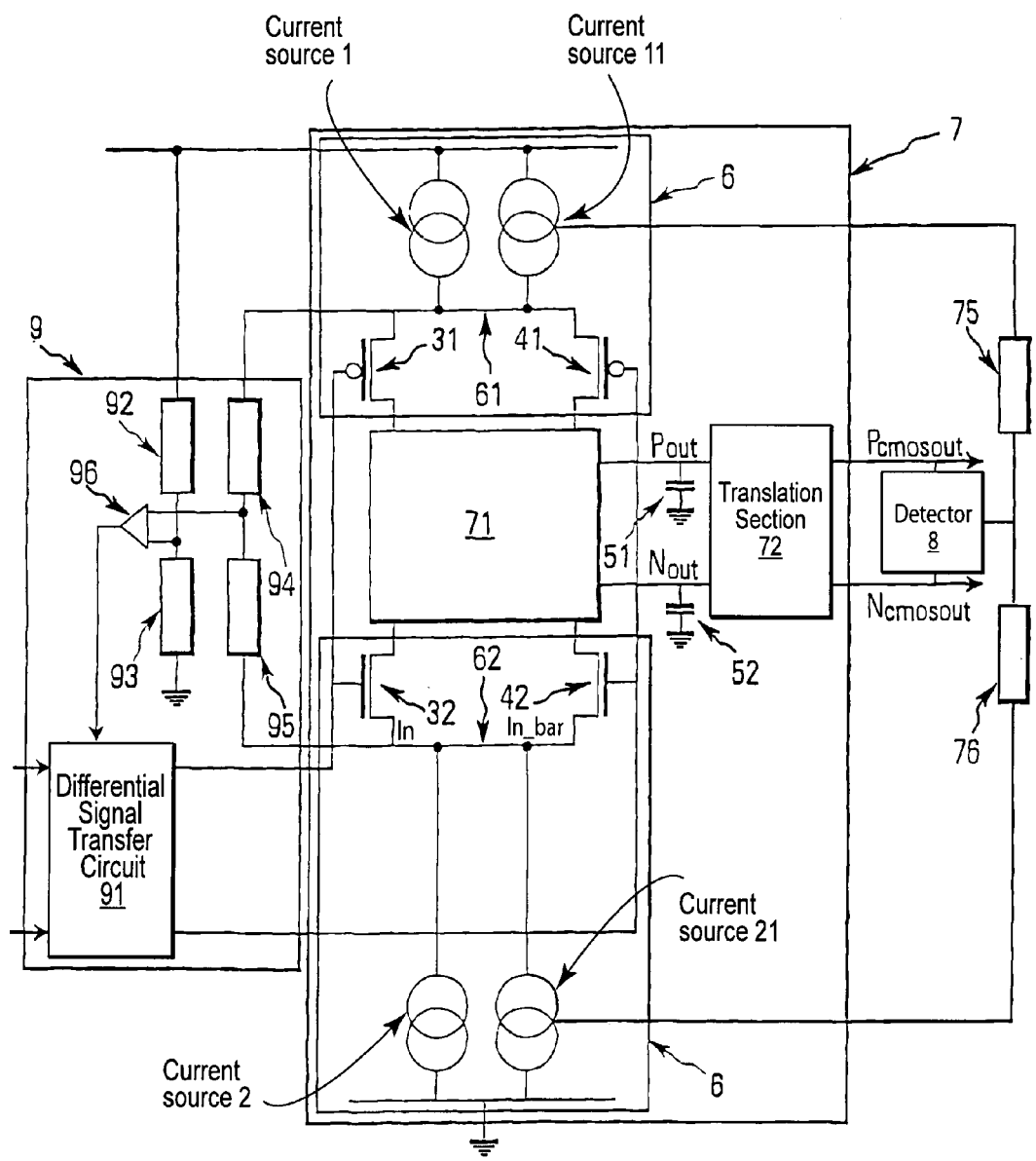
FIG. 6 shows a second embodiment of the present invention.

In operation, if during a transition between two opposing states, e.g., between a first stable state where $P_{CMOSout}$=high and $N_{CMOSout}$=low, and a second stable state where $N_{CMOSout}$=high and $P_{CMOSout}$=low, the outputs of the two lines cross the power supply divided by two threshold simultaneously as shown in FIG. 2a, then no circuit is formed between the output of the timing error detection unit 8 and either of the power supply rails. However, where a timing error exists, e.g., if the falling P-output of the amplification unit crosses the power supply divided by two threshold before the rising N-output, there will exist a period, during which both outputs are below the power supply divided by two thresholds. While this is the case, a current exists through transistors 81, 82, 83, and 84 as shown in FIG. 6a, meaning that a circuit is formed between the output of the timing error detection unit and the positive supply rail. Conversely, if a similar situation occurs such that both the N- and P-output of the amplification unit 71 are momentarily above the power supply divided by two thresholds, a circuit will exist through transistors 86, 87, 88, and 89 from the output of the timing error detection unit and the negative power supply rail as shown in FIG. 5b.

Periodic currents of this kind are averaged out by the integrating unit 85, so as to provide a voltage representative of the timing error in the output signal.

According to an embodiment of the invention where the first current source consists of two P channel MOSFET transistors whose sources are connected to the positive power supply rail, whose drains are connected to the upper current supply node 61 and the gate of the first P channel MOSFET is connected to a reference voltage, and the second current source consists of two N channel MOSFET transistors whose sources are connected to the negative power supply rail, whose drains are connected to the lower current supply node 62 and the gate of the first N channel MOSFET is connected to a reference voltage, then according to said embodiment a first terminal of a first resistor 75 is connected to the gate of the second P channel MOSFET transistor 11, and a first terminal of a second resistor 76 is connected to the gate of the second N channel MOSFET transistor 21, and the second terminals of both these resistors is connected to the output of the timing deviation detector, the voltage representative of the timing error in the output signal thereby controlling the current sources such that a source current at the output of the timing deviation detector circuit results in an increase in the current provided by the second current source and thus at the lower current supply node, and similarly a sink current at the output of the timing deviation detector circuit results in an increase in the current provided by the first current source and thus at the upper current supply node. The two current sources are thereby adjusted in a reciprocal manner, such that if the current from one is increased, the current from the other is decreased. It may be advantageous to add decoupling capacitors between gate and source of each of the current sources 11 and 21 in order to reduce adverse impacts of supply noise.

A further, possibly undesirable, result of the technique described above with reference to FIGS. 4, 5 and 6 is that during operation voltage changes may occur on the current supply nodes 61 and 62, i.e., the centre voltage between the current supply rails 61 and 62 may deviate from half of the power supply voltage, and therefore, the incoming differential signals at the input of the amplification circuit 7 shown in FIG. 1 may have a different centre voltage to that of the amplification circuit 7 itself. It is thus desirable to precondition the incoming signal so as to have a common mode offset corresponding to the half power supply voltage within the amplification circuit 7. According to a further embodiment of the invention shown in FIG. 6, this is achieved by means of a input signal pre-conditioning system 9, which according to the embodiment shown in FIG. 4 consists of two potential divider circuits comprising resistors 92, 93, 94, and 95, respectively, a comparator 96 and a differential signal transfer circuit 91. A first potential divider 92 and 93 provides a voltage equal to half the power supply voltage. A second potential divider 94, 95 provides a voltage corresponding to half the voltage across the current supply node 61 and 62. The comparator 96 provides a voltage corresponding to the difference between these two signals, the desired common mode level signal which is used by the differential signal transfer circuits to impose a common mode voltage on the input signals. Thus, the circuit 9 operates so as to position the incoming differential signal within the voltage range available between the current supply node 61 and 62.

The differential signal transfer circuit 91 may comprise a differential signal transfer circuit to control the common mode level of a differential signal, comprising an input common mode level detection circuit, for detecting the common mode level of an incoming signal, two capacitors coupled between the first input and output and the second input and output respectively, and a control circuit adapted to control an output common mode voltage level at the output terminals by controlling the levels of charge on the dependent on the common mode level of the incoming signal as detected by the input common mode detector.

The control circuit comprises a clock circuit, and a first and a second charge control circuit for said first and second capacitor respectively, each charge control circuit having a further capacitor, a first and second switching device, which are switched in an in phase manner by said clock circuit so as to, in a first stage of said clock's cycle to connect said switched capacitor across the output signal of the input common mode level detection device, representing the common mode level on the incoming signal, and to the output of the comparator 96, which provides the desired common mode level signal. In a second stage of said clock's cycle said switched capacitor in parallel with the first or second capacitor with which said charge control circuit is associated.

Figure 7:
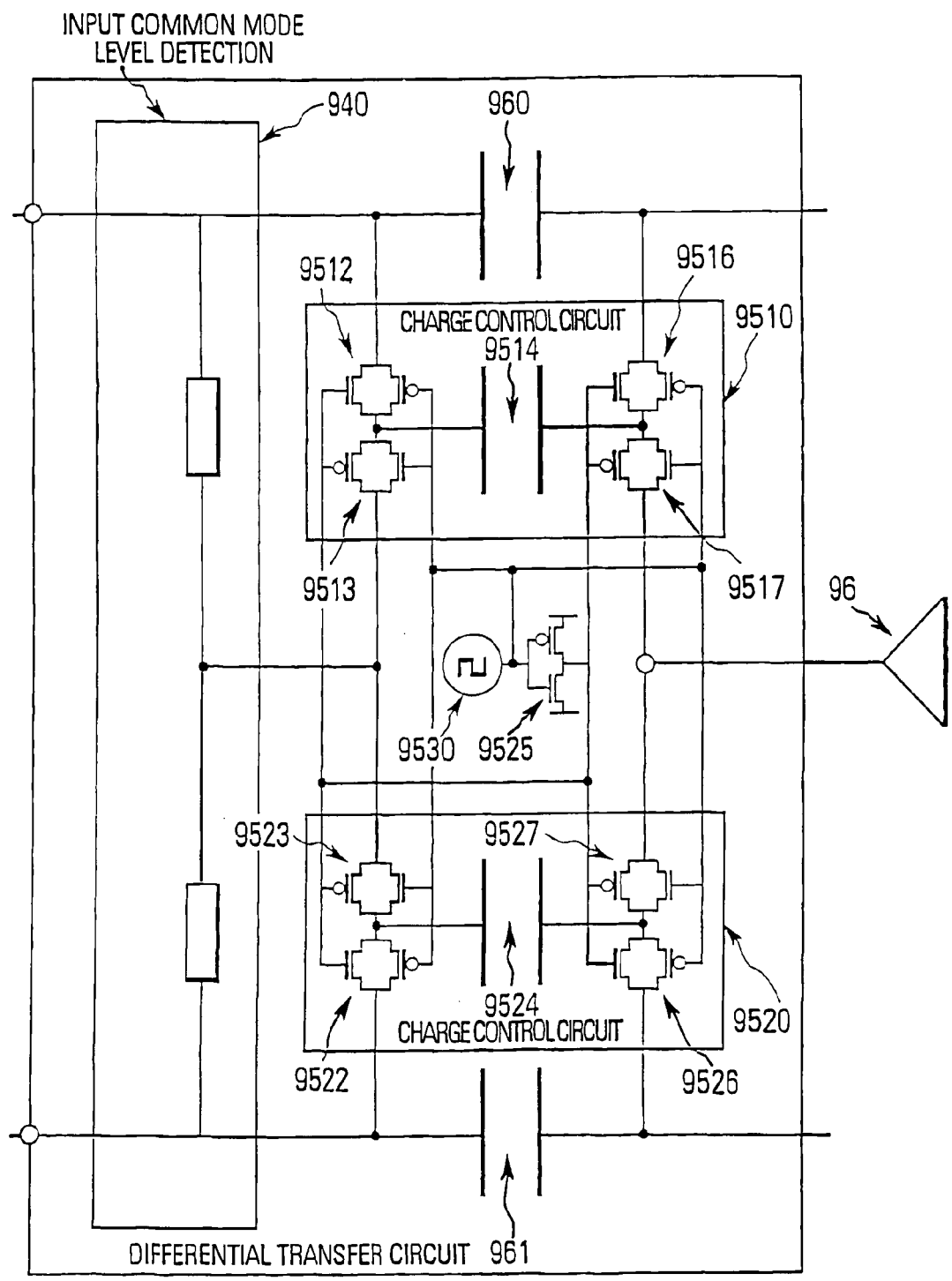
FIG. 7 shows a preferred implementation of differential signal transfer circuit 91, in which the switches are implemented as MOS transistors.

FIG. 7 shows a preferred implementation of differential signal transfer circuit 91, in which the switches are implemented as MOS transistors. The charge control circuit 9510 incorporates eight MOS transistors forming four transmission gates 9512, 9513, 9516, 9517 and a switched capacitor 9514. A clock signal generation circuit 9530 and an inverter 9525 which inverts the clock signal to provide an anti-clock signal 180° out of phase with said clock signal, are further provided.

The second charge control circuit 9520 comprises equivalent components.

A first transmission gate 9512 comprises an NMOS and a PMOS transistor whose sources are both connected to a first terminal of the switched capacitor 9514 and whose drains are connected to a first terminal of the capacitor 960. The gate of the PMOS transistor is connected to the signal from the clock signal generation circuit 9530, and the gate of the NMOS transistor is connected to the inverted clock signal at the output of the inverter 9525.

A second transmission gate 9513 comprises an NMOS and a PMOS transistor whose sources are both connected to a first terminal of the switched capacitor 9514 and whose drains are both connected to a node carrying a voltage representing the input signal common mode level as detected by the input common mode level detection circuit 940. The gate of the NMOS transistor is connected to the signal from the clock signal generation circuit 9530, and the gate of the PMOS transistor is connected to the inverted clock signal at the output of the inverter 9525.

A third transmission gate 9516 comprises an NMOS and a PMOS transistor whose sources are both connected to a second terminal of the switched capacitor 9514 and whose drains are connected to a second terminal of the capacitor 960. The gate of the PMOS transistor is connected to the signal from the clock signal generation circuit 9530, and the gate of the NMOS transistor is connected to the inverted clock signal at the output of the inverter 9525.

A fourth transmission gate 9517 comprises an NMOS and a PMOS transistor whose sources are both connected to a first terminal of the switched capacitor 9514 and whose drains are connected to the output of the comparator 96, which provides the desired common mode level signal. The gate of the NMOS transistor is connected to the signal from the clock signal generation circuit 9530, and the gate of the PMOS transistor is connected to the inverted clock signal at the output of the inverter 9525.

Thus the first NMOS and PMOS transistor pair 9513 switch a connection between the common mode level and a first terminal of the switched capacitor 9514, switched by the clock signal and the inverted clock signal respectively, a second NMOS and PMOS transistor pair 9513 switch a connection between a differential transfer circuit input side of the first capacitor 960 and said first terminal of the switched capacitor 9514, switched by the inverted clock signal and the clock signal respectively, a third NMOS and PMOS transistor pair 9517 switch a connection between the output of the comparator 96, which provides the desired common mode level signal and a second terminal of the capacitor, switched by the clock signal and the inverted clock signal respectively, and a fourth NMOS and PMOS transistor pair 9516 switch a connection between a differential transfer circuit output side of the first capacitor 960 and said second terminal of the switched capacitor 514, switched by the inverted clock signal and the clock signal respectively.

The components of the charge control circuit 9520 are arranged in a similar manner.

In operation, during a first phase of said clock a circuit will exist through the first and third transmission gates 9512 and 9516, but not through the second and fourth transmission gates 9513 and 9517, due to the opposite arrangements of these gates, whereby the NMOS transistors of the first and third transmission gates are controlled by the inverted clock signal, and in the second and fourth transmission gates by the non inverted clock signal. Thus during a first phase of said clock signal the switched capacitor (9514, 9524) is connected in parallel with the capacitor coupled between the input and the output of the transfer circuit, and during a second phase of said clock the switched capacitor (9514, 9524) is connected between the output of the comparator 96, which provides the desired common mode level signal and the detected common mode voltage (30).

The second charge control circuit 9520 operates in a similar manner.

Use of this technique has the further advantage of compensating for alias common mode signals originating from common mode error signals at frequencies higher than half the nyquist frequency of the differential signal transfer circuit, that is, in the case of the arrangement described above, the switching rate of the switched capacitors.

As will be readily appreciated by the person skilled in the art, the concepts herein disclosed are applicable not only to a differential line receiver circuit, but equivalently also to non differential signalling such as TTL, CMOS, ECL etc, by detecting deviations between the rise time and the fall time of the binary signal and controlling pull-up current sources and pull-down current sources in the line receiver circuit such that the fall time and the rise time are essential equal.

While specific embodiments have been described for explanatory purposes, it is readily apparent to those skilled in the art that various modifications may be envisaged. All such modifications which retain the basic underlying principles of the invention herein disclosed are within the scope of this invention, as defined by the appended claims.

The invention claimed is:

1. A differential line receiver circuit for receiving differential digital signals from a transmission line, comprising
    a differential input stage having a differential input for coupling with said transmission line;
    an output stage having a differential signal current interface with said input stage for receiving differential driving currents from said input stage, and a circuit for translating said driving currents into complementary binary output signals, the rise time and fall time of the edges of said binary output signals depending on the levels of said driving currents; and
    a timing deviation detector circuit coupled to the outputs of said output stage, for detecting at least one of deviations between the rise time and the fall time of said complementary binary output signals and deviations of the timing of the rising and the falling edges, and generating a detector signal in accordance with the detected deviation; wherein said input stage comprises
    a first current source for generating a source current and a second current source for generating a sink current; and
    a switching stage for switching in accordance with said signals received from said transmission line said currents generated by said first and said second current sources into said interface of said output stage for translation by said output stage into said complementary binary output signals; and
    a current source control circuit for controlling the respective amount of current generated by at least one of said first and said second current sources by generating respective current control signals based on said detector signal.

2. The line receiver circuit according to claim 1, wherein said input stage has a first current supply node coupled with said first current source, and further comprising:
    a second current supply node coupled with said second current source;
    a detector circuit for detecting a centre voltage level of the voltage across said first and second current supply nodes;
    a control circuit for controlling the centre voltage level of the voltage across said first and second current nodes, said control circuit comprising
        a common mode level adjustment circuit having a differential input for coupling with said transmission line and a differential output coupled with said differential input of said input stage, for adjusting the common mode level of said differential input signal received from said transmission line at said differential input of said input stage of said line receiver circuit in accordance with a common mode adjustment signal; and
        a feed back circuit for comparing said detected centre voltage level of the voltage across said first and second current nodes with a reference voltage and generating said common mode adjustment signal in accordance with the result of said comparison.

3. The differential line receiver circuit according to claim 1 wherein said switching stage comprises
    a pair of p channel MOSFETs the sources of which are connected together and with said first current source; and
    a pair of n channel MOSFETs the sources of which are connected together and with said second current source;
    the gates of a first one of said p channel MOSFETs and of a first one of said n channel MOSFETs being connected together to constitute a first input of said switching stage and the gates of a second one of said p channel MOSFETs and of a second one of said n channel MOSFETs being connected together to constitute a second input of said switching stage;
    the drains of said pair of n channel transistors and the drains of said pair of p channel transistors being coupled to sink and source, respectively, the currents generated by said first and second current sources into and from said interface to said output stage in accordance with the differential input signal at the input of said switching stage.

4. The differential line receiver circuit according to claim 1 wherein said output stage is adapted to perform the function of receiving said differential driving currents from said input stage and converting said differential driving currents into binary differential CMOS signals.

5. The differential line receiver circuit according to claim 1, wherein said output stage comprises a first and second pair of current mirror circuits in a push pull arrangement connected to a first and second output node, respectively, arranged such that in each input logic state one current mirror in each push pull pair is supplied with a current by said switching stage, while the other current mirror circuit in each push pull pair receives substantially no current, where in one of said push pull pairs it is the current mirror circuit in a push configuration which receives said current, and in the other of said push pull pairs it is the current mirror circuit in a pull configuration which receives said current such that in each input logic state one of said output nodes is at a high potential, and the other at a low potential.

6. The differential line receiver circuit according to claim 5, wherein said first pair of current mirror circuits comprises
    a first current mirror consisting of a first and a second P channel MOSFET transistor, the gates of which are coupled together and further coupled to the drain of said first transistor and an output of said switching stage, switchably coupled via a first switching element to said lower current supply node, the sources said first and second P channel MOSFET transistors are coupled to the positive power supply rail and the drain of said second P channel MOSFET transistor is connected to said first output node, and a second current mirror consisting of a first and a second N channel MOSFET transistor, the gates of which are coupled together and further coupled to the drain of said first transistor and an output of said switching stage, switchably coupled via a second switching element to said upper current supply node, the sources of said first and second N channel MOSFET transistors are coupled to the negative power supply rail and the drain of said second N channel MOSFET transistor is connected to said first output node, and wherein said second pair of current mirror circuits comprises a third current mirror consisting of a third and a fourth P channel MOSFET transistor, the gates of which are coupled together and further coupled to the drain of said third transistor and an output of said switching stage, switchably coupled via a third switching element to said lower current supply node, the sources of said third and fourth P channel MOSFET transistors are coupled to the positive power supply rail and the drain of said fourth P channel MOSFET transistor is connected to said second output node, and a fourth current mirror consisting of a third and a fourth N channel MOSFET transistor, the gates of which are coupled together and further coupled to the drain of said first transistor and an output of said switching stage, switchably coupled via a fourth switching element to said upper current supply node, the sources of said third and fourth N channel MOSFET transistors are coupled to the negative power supply rail and the drain of said fourth N channel MOSFET transistor is connected to said second output node.

7. The differential line receiver circuit according to claim 1, wherein said timing deviation detector circuit comprises two inputs, one output and a plurality of transistors so arranged as to give an output having a first value if both inputs are above a given voltage threshold, a high impedance output if the two input values are either side of said given threshold, and to give an output having a third value if both inputs are below said given threshold, said timing deviation detector circuit further comprising an integrating means coupled to said output such that said output value is averaged over time.

8. The differential line receiver circuit according to claim 7, wherein said timing detector circuit comprises a first branch and a second branch, each branch having a pair of nested CMOS inverters; the inner CMOS inverter of said first branch and the outer CMOS inverter of said second branch having their inputs coupled together in order to constitute said one of the two inputs of said timing deviation detector circuit, the outer CMOS inverter of said first branch and the inner CMOS inverter of said second branch having their inputs coupled together in order to constitute the other of the two inputs of said timing detector circuit; the output of the inner CMOS inverter of said first branch and the output of said inner CMOS inverter of said second branch being coupled together to constitute the output of said timing deviation detector circuit.

9. The line receiver circuit according to claim 1, wherein said first and second current sources, respectively, are controllable in accordance with a first and second current control signal, respectively, and said current source control circuit is adapted for reciprocally controlling the respective amounts of current generated by said first and second current sources by generating said first and second current control signals based on said detector signal.

10. The differential line receiver circuit according to claim 9, wherein said first current source for generating a source current in accordance with a first current level control signal comprises a first and a second P channel transistor, the source of each of said P channel transistors being coupled to the positive power supply rail and the drain of each of said P channel transistors being coupled to said upper current supply node, the gate of said first P channel transistor being coupled to a first reference voltage and the gate of said second P channel transistor being coupled to said first current level control signal, and said second current source for generating a sink current in accordance with a second current level control signal comprises a first and a second N channel transistor, the source of each of said N channel transistors being coupled to the negative power supply rail and the drain of each of said N channel transistors being coupled to said lower current supply node, the gate of said first N channel transistor being coupled to a second reference voltage and the gate of said second N channel transistor being coupled to said second current level control signal.

11. The differential line receiver circuit according to claim 1, wherein said current source control circuit comprises a first current control signal node coupled to said first current source so as to control the source current generated thereby, a second current control signal node coupled to said second current source so as to control the sink current generated thereby, a detector signal node coupled to the output of said timing deviation detector, a first resistive element coupled between said first current control signal node and said detector signal node, and a second resistive element coupled between said second current control signal node and said detector signal node;

a first decoupling capacitor coupled between said first current control signal node and a first power supply potential; and a second decoupling capacitor coupled between said second current control signal node and a second power supply potential.

12. The differential line receiver circuit according to claim 2, wherein said common mode level adjustment circuit comprises a first and second input terminal for connection with a differential transmission line;

a first and a second output terminal for connection with the inputs of a differential line receiver;

an input common mode level detection circuit, for detecting the common mode level of an incoming signal across said first and second terminals;

a first capacitor coupled between said first input terminal and said first output terminal;

a second capacitor coupled between said second input terminal and said second output terminal;

a control circuit adapted to control an output common mode voltage level at the first and second output terminals by controlling the levels of charge on the first and second capacitors dependent on the common mode level of the incoming signal as detected by the input common mode detector, wherein said control circuit comprises a clock circuit, and
a first and a second charge control circuit for said first
and second capacitor respectively, each charge control
circuit having a further capacitor, a first and second switching device, which are switched in
an in phase manner by said clock circuit so as to, in a first stage of said clock's cycle to connect said
switched capacitor across the output signal of the input
common mode level detection device, representing the
common mode level on the incoming signal, and said
common mode adjustment signal, in a second stage of said clock's cycle said switched
capacitor in parallel with the first or second capacitor
with which said charge control circuit is associated.

13. The differential line receiver circuit according claim 2, wherein said feedback circuit comprises an operational amplifier the output of which provides said common mode adjustment signal to said common mode level adjustment circuit, a third resistive element coupled between the positive power supply rail and the non inverting input of said operational amplifier, and a fourth resistive element coupled between the negative power supply rail and the non inverting input of said operational amplifier, a fifth resistive element coupled between said upper current supply node and the inverting input of said operational amplifier, and a sixth resistive element coupled between said lower current supply node and the inverting input of said operational amplifier.

* * * * *